(12) United States Patent
Hu (10) Patent No.: US 8,816,212 B2
(45) Date of Patent: Aug. 26, 2014

(54) FLEXIBLE DEVICE AND FABRICATING METHOD THEREOF

(75) Inventor: Chih-Jen Hu, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 572 days.

(21) Appl. No.: 13/092,991

(22) Filed: Apr. 25, 2011

(65) Prior Publication Data

US 2011/0267320 A1 Nov. 3, 2011

(30) Foreign Application Priority Data

Apr. 30, 2010 (TW) .............................. 99113983 A (51) Int. Cl.
| | |
|---|---|
| *H05K 1/00* | (2006.01) |
| *G02F 1/1345* | (2006.01) |
| *H05K 3/32* | (2006.01) |
| *H05K 1/18* | (2006.01) |

(52) U.S. Cl.
CPC ............ *G02F 1/13452* (2013.01); *H05K 3/323* (2013.01); *H05K 1/189* (2013.01); *H05K 2201/10128* (2013.01)
USPC ...................... 174/254; 174/50.51; 174/50.63; 361/749; 361/807

(58) Field of Classification Search
USPC .......... 174/50.51, 50.52, 50.54, 50.62, 50.63, 174/73.1, 254, 260, 265, 268; 361/749, 361/751, 760, 807, 809
See application file for complete search history.

(56) References Cited

U.S. PATENT DOCUMENTS

| | | | |
|---|---|---|---|
| 6,459,144 B1 * | 10/2002 | Pu et al. ......................... | 257/667 |
| 6,579,422 B1 | 6/2003 | Kakinuma | |
| 6,819,376 B1 | 11/2004 | Muramatsu | |
| 6,894,229 B1 * | 5/2005 | Cheah ........................... | 174/255 |
| 7,019,809 B2 | 3/2006 | Sekiguchi | |
| 7,573,131 B2 * | 8/2009 | Cui et al. ....................... | 257/707 |
| 2003/0210531 A1 * | 11/2003 | Alcoe et al. ................... | 361/728 |
| 2007/0035690 A1 | 2/2007 | Chen | |
| 2008/0030666 A1 * | 2/2008 | Abe et al. ...................... | 349/150 |
| 2008/0099898 A1 * | 5/2008 | Cui et al. ...................... | 257/678 |
| 2008/0207077 A1 | 8/2008 | Haase | |
| 2009/0032297 A1 * | 2/2009 | Aallos et al. .................. | 174/260 |
| 2009/0141438 A1 * | 6/2009 | Aita et al. ................. | 361/679.21 |
| 2009/0310314 A1 * | 12/2009 | Shinn et al. ................... | 361/749 |
| 2011/0182046 A1 * | 7/2011 | Shiota ........................... | 361/760 |

FOREIGN PATENT DOCUMENTS

| | | |
|---|---|---|
| CN | 1761382 A | 4/2006 |
| JP | H11-260973 | 9/1999 |

OTHER PUBLICATIONS

"First Office Action of China Counterpart Application", issued on Sep. 21, 2011, p. 1-p. 5, in which the listed references were cited.

* cited by examiner

*Primary Examiner* — Hoa C Nguyen
(74) *Attorney, Agent, or Firm* — Jianq Chyun IP Office (57) ABSTRACT

A flexible device has a flexible panel, a driver, and a restraining component. The flexible panel includes a main region and a driver bonding region outside the main region. The driver is electrically connected to the driver bonding region. The restraining component is disposed adjacent to the driver bonding region. Rigidity of the restraining component is greater than rigidity of the flexible panel, and coefficient of thermal expansion of the restraining component is smaller than coefficient of thermal expansion of the flexible panel.

15 Claims, 11 Drawing Sheets

FLEXIBLE DEVICE AND FABRICATING METHOD THEREOF

CROSS-REFERENCE TO RELATED APPLICATION

This application claims the priority benefit of Taiwan application serial no. 99113983, filed on Apr. 30, 2010. The entirety of the above-mentioned patent application is hereby incorporated by reference herein and made a part of this specification.

BACKGROUND OF THE PRESENT INVENTION

1. Field of the Present Invention

The present invention relates to a flexible device and a fabricating method thereof. More particularly, the present invention relates to a flexible display and a fabricating method thereof.

2. Description of Related Art

With rapid development of display technologies, conventional cathode ray tube (CRT) displays have been gradually replaced by flat panel displays (FPD). In comparison with the FPD formed by a rigid substrate (e.g. a glass substrate), a flexibly display in which an active device is formed on a flexible substrate has been developed according to recent researches because the flexible substrate (e.g. a plastic substrate) is characterized by flexibility and impact endurance.

In such case, the flexible substrate is often adhered to the rigid substrate, and then a series of film deposition processes can be performed to form a flexible display panel. Drivers (e.g. a scan driver and a data driver) are then adhered to the flexible display panel through an anisotropic conductive adhesive, such that conductive bumps of the drivers are electrically connected to pads of the flexible display panel through conductive particles in the anisotropic conductive adhesive, and that the flexible display panel is electrically connected to the drivers. After all the processes are completely performed, the flexible display panel is removed from the rigid substrate.

Since coefficient of thermal expansion (CTE) of the flexible substrate is relatively large in most cases, thermal stability of the flexible substrate is insufficient. During the fabricating process of the flexible display, significant stress is accumulated on the flexible substrate because the flexible substrate is expanded or contracted due to environmental variations in temperature. Therefore, when the flexible display panel is removed from the rigid substrate, the flexible substrate of the flexible display panel is contracted to a great extent, and the stress is released, which causes the conductive bumps between the drivers and the flexible display panel to be peeled off or broken. As such, electrical connection between the drivers and the flexible display panel is adversely affected, and the drivers cannot function. Besides, said stress may also deteriorate electrical connection between a flexible circuit board and the flexible display panel. On the other hand, in another conventional fabricating process, the active device is formed on the flexible substrate, and the flexible display panel is removed from the rigid substrate, so as to contract the flexible substrate. The drivers and the flexible display panel are then bonded, and subsequent package processes are performed. Nonetheless, during the bonding process of the drivers and the flexible display panel and other subsequent fabricating processes, the flexible substrate of the flexible display panel still undergoes different temperature variations. Accordingly, the expanded or contracted flexible substrate is likely to pose a negative impact on the electrical connection between the drivers and the flexible display panel or between the flexible circuit board and the flexible display panel.

SUMMARY OF THE PRESENT INVENTION

The present invention is directed to a flexible device and a fabricating method thereof in order to ensure favorable electrical connection between a flexible panel and a driver.

In the present invention, a flexible device including a flexible panel, a driver, and a restraining component is provided. The flexible panel has a main region and a driver bonding region outside the main region. The driver is electrically connected to the driver bonding region. The restraining component is disposed adjacent to the driver bonding region. Here, rigidity of the restraining component is greater than rigidity of the flexible panel, and coefficient of thermal expansion of the restraining component is smaller than coefficient of thermal expansion of the flexible panel In the present invention, a fabricating method of a flexible device is provided as well. According to the fabricating method, a flexible panel is formed on a rigid substrate. The flexible panel has a main region and a driver bonding region outside the main region. A driver is bonded to the driver bonding region. A restraining component is formed adjacent to the driver bonding region. Here, rigidity of the restraining component is greater than rigidity of the flexible panel, and coefficient of thermal expansion of the restraining component is smaller than coefficient of thermal expansion of the flexible panel.

In the present invention, another flexible device including a flexible panel, a driver, and a restraining component is provided. The flexible panel has a main region and a driver bonding region outside the main region. The driver is electrically connected to the driver bonding region. The restraining component is disposed adjacent to the driver bonding region. Coefficient of thermal expansion of the restraining component is CTE, coefficient of thermal expansion of the flexible panel is $CTE_{SUB}$, and coefficient of thermal expansion of the driver is $CTE_{CHIP}$. Here, a difference $|CTE_{SUB}-CTE_{CHIP}|$ between the coefficient of thermal expansion of the flexible panel and the coefficient of thermal expansion of the driver is greater than a difference $|CTE-CTE_{CHIP}|$ between the coefficient of thermal expansion of the restraining component and the coefficient of thermal expansion of the driver.

Based on the above, the restraining component is disposed between the flexible panel and the driver according to the present invention. The coefficient of thermal expansion of the restraining component is smaller than that of the flexible panel, and therefore the contraction amount of the flexible panel can be restrained by the restraining component in order to prevent significant contraction of the flexible panel due to variations in temperature. Thereby, satisfactory electrical connection between the flexible panel and the driver can be ensured.

In order to make the aforementioned and other features and advantages of the present invention more comprehensible, embodiments accompanying figures are described in detail below.

BRIEF DESCRIPTION OF THE DRAWINGS

The accompanying drawings are included to provide a further understanding of the present invention, and are incorporated in and constitute a part of this specification. The drawings illustrate embodiments of the present invention and, together with the description, serve to explain the principles of the present invention.

FIG. 3A to FIG. 7A are schematic top views illustrating a flexible display according to an embodiment of the present invention, and FIG. 3B to FIG. 7B are schematic cross-sectional views taken along the line A-A' depicted in FIG. 1A to FIG. 7A.

DESCRIPTION OF EMBODIMENTS

Figure 1A:
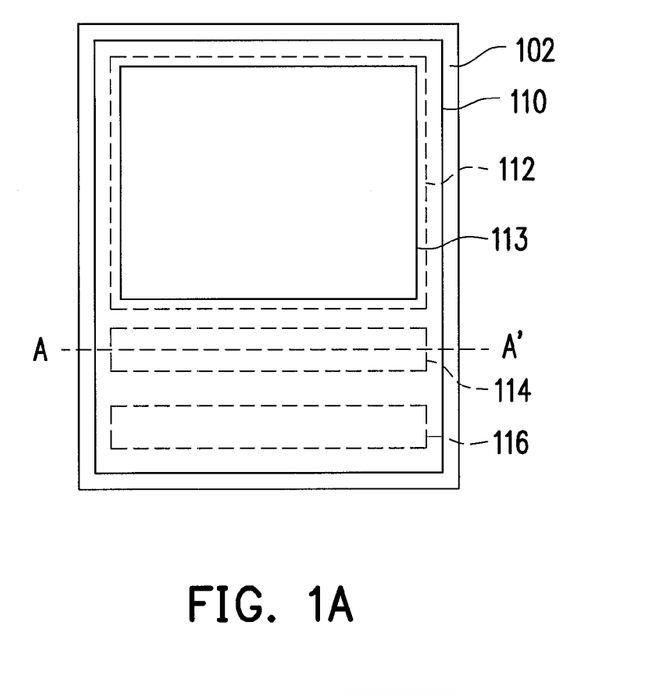
FIG. 1A to FIG. 1E are schematic top views illustrating processes in a fabricating method of a flexible display according to an embodiment of the present invention.

FIG. 1A to FIG. 1E are schematic top views illustrating processes in a fabricating method of a flexible device according to an embodiment of the present invention. FIG. 2A to FIG. 2E are schematic cross-sectional views taken along lines A-A' and B-B' depicted in FIG. 1A to FIG. 1E. As shown in FIG. 1A and FIG. 2A, a flexible panel 110 (e.g. a flexible display panel) is formed on a rigid substrate 102. The flexible panel 110 has a main region 112 (e.g. display region), a driver bonding region 114 outside the main region 112, and a flexible printed circuit (FPC) bonding region 116. In the present embodiment, the rigid substrate 102, for example, is a glass substrate, a quartz substrate, a silicon substrate, or any other substrate made of solid materials. The flexible panel 110 includes a flexible substrate 111 and a display unit 113. The flexible substrate 111, for instance, is a plastic substrate featuring great flexibility, and the flexible substrate 111 of the flexible panel 110 is adhered to the rigid substrate 102. The display unit 113 is disposed on the flexible substrate 111 and located in the main region 112. In the present embodiment, coefficient of thermal expansion $CTE_{SUB}$ of the flexible panel 110 ranges from about 4 ppm/c to about 100 ppm/c, for example. In another embodiment of the present application, the flexible panel 110 may be formed by a roll-to-roll process.

Figure 1B:
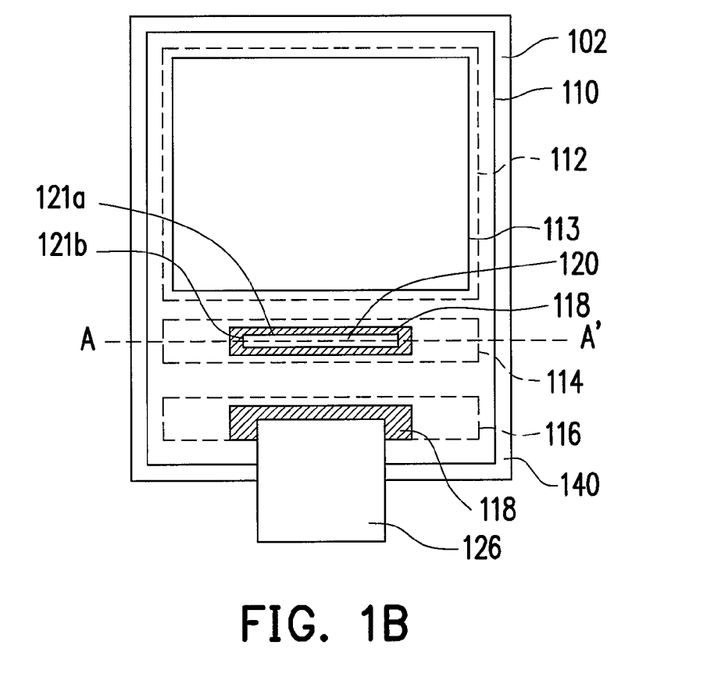
Figure 2A:
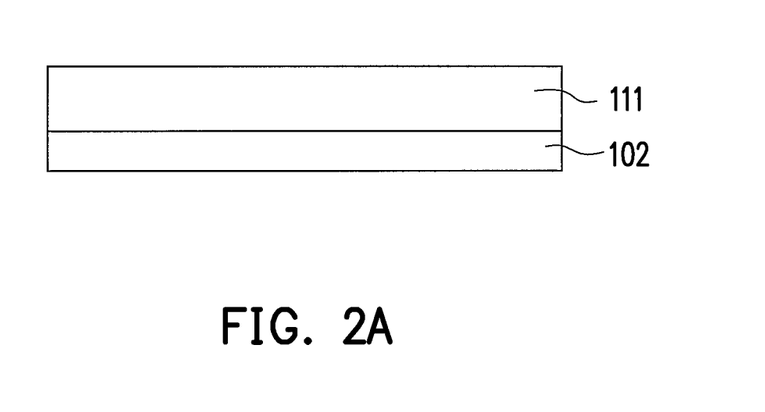
FIG. 2A to FIG. 2E are schematic cross-sectional views taken along lines A-A' and B-B' depicted in FIG. 1A to FIG. 1E.
Figure 2B:
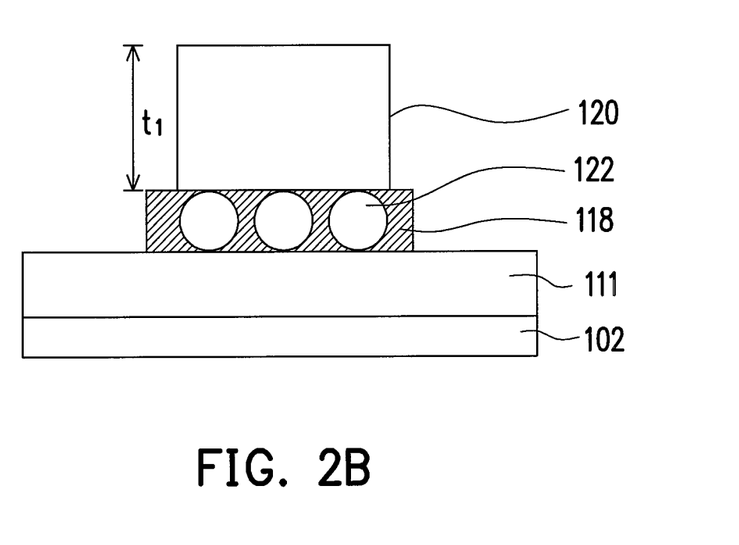

A driver 120 is bonded to the driver bonding region 114, as shown in FIG. 1B and FIG. 2B. According to the present embodiment, for example, the driver 120 and the driver bonding region 114 are bonded to each other by adhering an anisotropic conductive film (ACF) 118 onto the driver bonding region 114 and then pressing the driver 120 onto the ACF 118, such that a plurality of conductive bumps 122 of the driver 120 can be electrically connected to the driver bonding region 114 through conductive particles in the ACF 118, and that the driver 120 can be electrically connected to the flexible panel 110. Here, the driver 120 is, for example, a silicon IC and has a pair of long sides 121a, a pair of short sides 121b, and thickness t1. Coefficient of thermal expansion $CTE_{CHIP}$ of the driver 120 ranges from about 1 ppm/c to about 20 ppm/c, for example.

The fabricating method of the flexible device 100 can further include a step of bonding a flexible circuit 126 to the FPC bonding region 116 of the flexible panel 110. The flexible circuit 126 and the FPC bonding region 116, for example, can be bonded to each other by adhering the ACF 118 onto the FPC bonding region 116 and pressing the flexible circuit 126 onto the ACF 118, such that the flexible circuit 126 is electrically connected to the FPC bonding region 116 through the ACF 118, and that the flexible circuit 126 can be electrically connected to the flexible panel 110. According to the present embodiment, the ACF 118 is used for adhering the driver 120 to the driver bonding region 114 and adhering the flexible circuit 126 to the FPC bonding region 116, while people having ordinary skill in the pertinent art can also bond the driver 120 to the driver bonding region 114 or bond the flexible circuit 126 to the FPC bonding region 116 through other ways, e.g. by means of an anisotropic conductive adhesive.

Figure 1C:
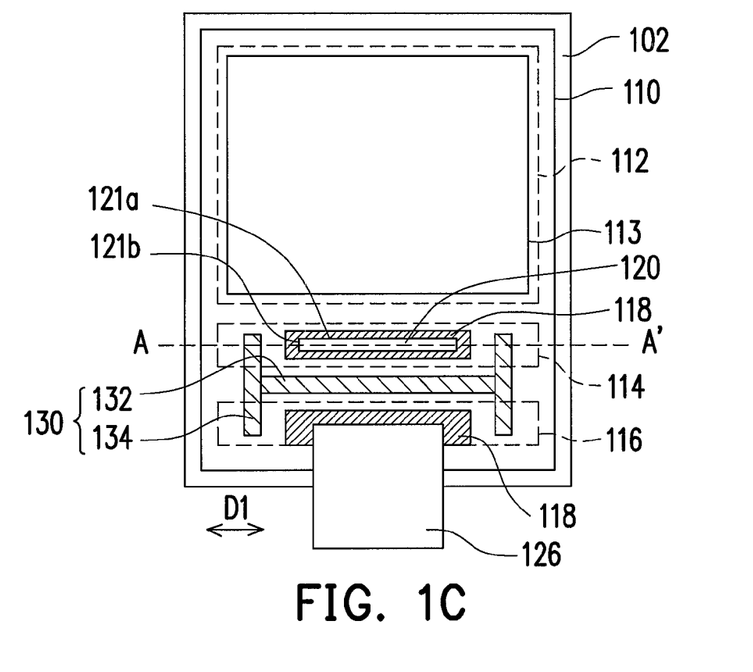
Figure 2C:
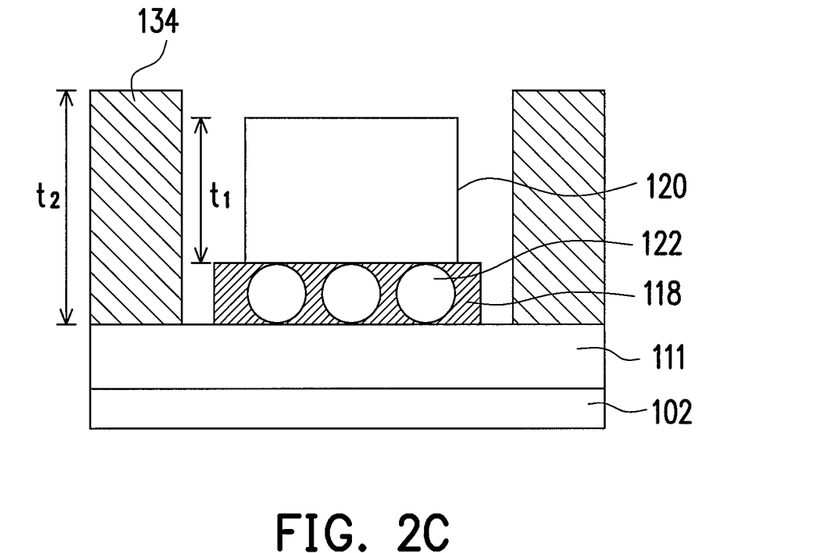

With reference to FIG. 1C and FIG. 2C, a restraining component 130 (e.g. a contraction restraining component) is formed adjacent to or around the driver bonding region 114. Rigidity of the restraining component 130, for example, is greater than rigidity of the flexible panel 110, and coefficient of thermal expansion CTE of the restraining component 130, for example, is smaller than the coefficient of thermal expansion $CTE_{CHIP}$ of the flexible panel 110. In the present embodiment, the coefficient of thermal expansion CTE of the restraining component 130 ranges from about 1 ppm/c to about 30 ppm/c, for example, and the rigidity of the restraining component 130 ranges from about 3 Gpa to about 400 Gpa, preferably from about 8 Gpa to about 400 Gpa, for example. In addition, the difference $|CTE_{SUB}-CTE_{CHIP}|$, for instance, is greater than the difference $|CTE-CTE_{CHIP}|$. In the present embodiment, a material of the restraining component 130 can include metal, plastic, curable adhesive, or any other material. Here, the curable adhesive can be light curable adhesive, thermal curable adhesive, or a combination thereof. When the material of the restraining component 130 includes the curable adhesive, a method of curing the restraining component 130 further includes light irradiation (e.g. with use of visible light or ultraviolet light) or heating.

In the present embodiment, the restraining component 130 includes at least one first contraction restraining bar 132 and two second contraction restraining bars 134, for instance. An extension direction of the first contraction restraining bar 132 is exemplarily parallel to a pair of long sides 121a of the driver 120, and the two second contraction restraining bars 134 are exemplarily connected to two ends of the first contraction restraining bar 132. In addition, an extension direction of each of the second contraction restraining bars 134, for example, is substantially perpendicular to the first contraction restraining bar 132, i.e. the restraining component 130 is in a shape of the letter I, for instance. Thickness t2 of the restraining component 130 (e.g. the second contraction restraining bar 134) is greater than the thickness t1 of the driver 120, for instance. However, in other embodiments, the thickness t2 of the restraining component 130 can also be smaller than or equal to the thickness t1 of the driver 120. In the present embodiment, a first direction D1 is substantially parallel to the long sides 121a of the driver 120, and the contraction amount of the flexible panel 110 along the first direction D1 is restrained by the restraining component 130, for example. Namely, the rigidity of the restraining component 130 is greater than the rigidity of the flexible panel 110, and the coefficient of thermal expansion CTE of the restraining component 130 is smaller than the coefficient of thermal expansion $CTE_{CHIP}$ of the flexible panel 110. Hence, on the condition of the same temperature variation, the flexible panel 110 is contracted or expanded to a better extent than the restraining component 130 with the relatively great rigidity, such that the restraining component 130 is capable of restraining expansion or contraction of the flexible panel 110. The second contraction restraining bars 134 of the restraining component 130 can extend from the driver bonding region 114 to the FPC bonding region 116 according to the present embodiment, so as to better restrain contraction or expansion of the flexible panel 110, which is however not limited in this invention. Based on actual design requirements, the restraining component 130 can exclusively cover the driver bonding region 114 or exclusively cover the FPC bonding region 116.

Figure 1D:
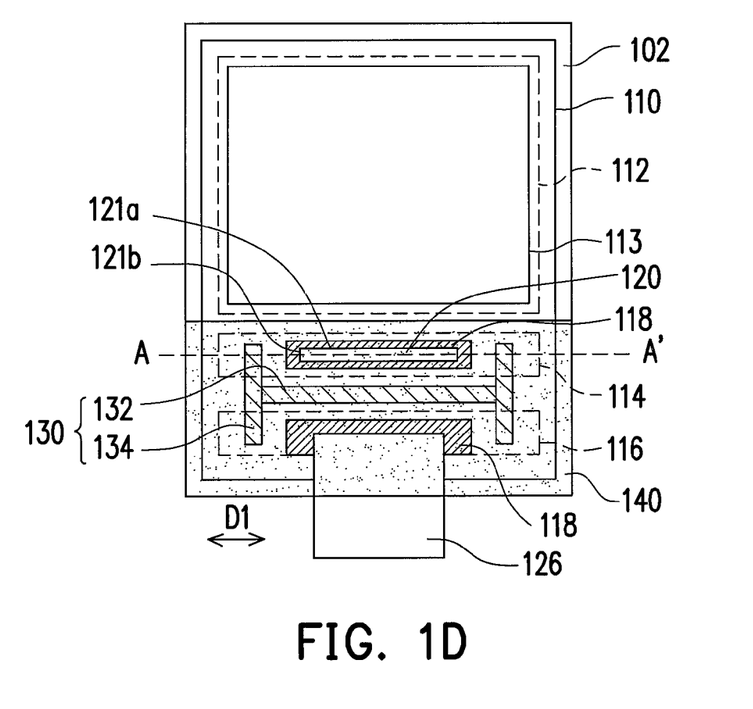
Figure 2D:
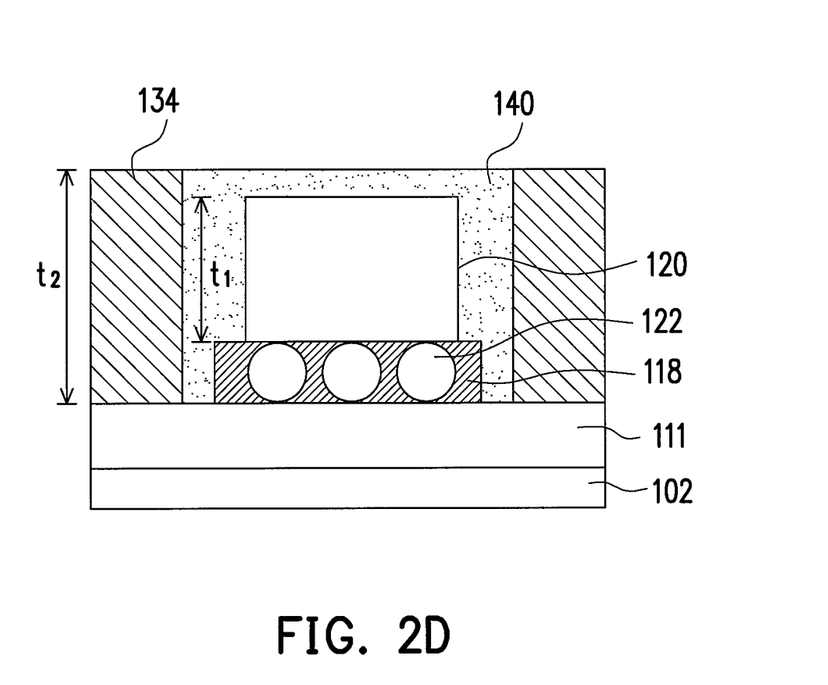

A molding compound 140 is formed on the driver bonding region 114 to encapsulate the driver 120, as shown in FIG. 1D and FIG. 2D. A material of the molding compound 140 is epoxy resin or any other insulating material, for example. In the present embodiment, the molding compound 140 further encapsulates the flexible circuit 126 that is connected to the flexible panel 110, for instance. As such, the electrical connection between the driver 120 and the flexible panel 110 or the electrical connection between the flexible circuit 126 and the flexible panel 110 is not affected by the surroundings. Note that the step of forming the molding compound 140 can be omitted in other embodiments based on actual conditions and users' intention.

Figure 1E:
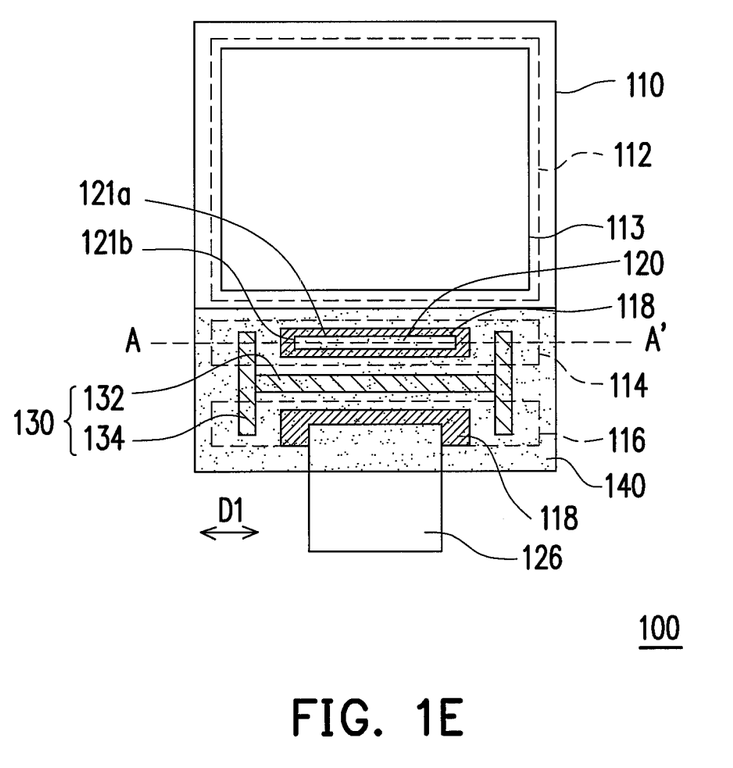
Figure 2E:
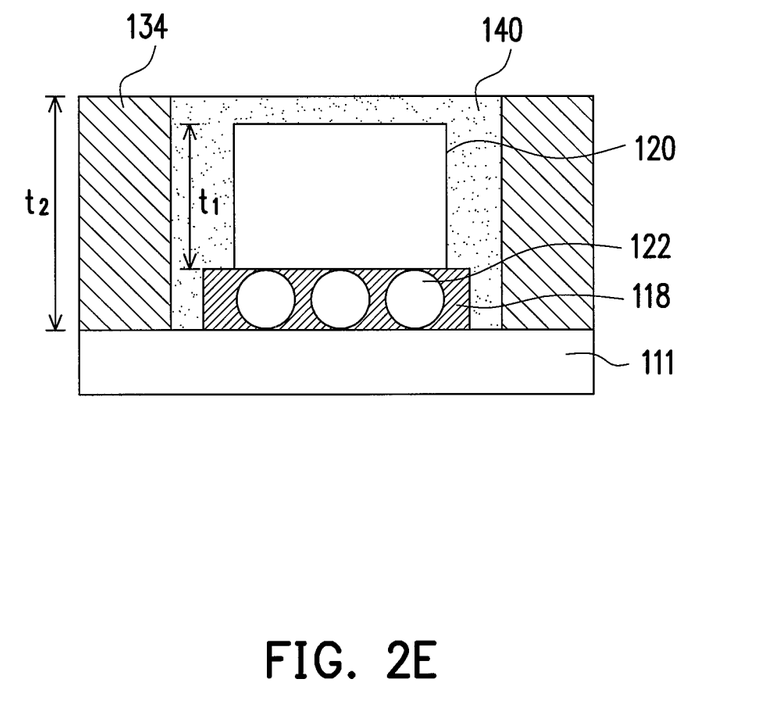

According to the present embodiment, after the restraining component 130 is formed, the fabricating method of the present embodiment further includes the step of removing the flexible panel 110 from the rigid substrate 120 to complete fabrication of the flexible device 100, as shown in FIG. 1E and FIG. 2E.

In the previous embodiments, the flexible panel 110 is removed from the rigid substrate 102 after the restraining component 130 is formed. However, note that the flexible panel 110 can be removed from the rigid substrate 102 before the restraining component 130 is formed on the flexible panel 110 according to another embodiment. At this time, it is preferable to assess possible impact of temperature in the subsequent manufacturing processes and probable environmental impact on the flexible panel 110, so as to allow the restraining component 130 to restrain contraction or expansion of the flexible panel 110 in the subsequent manufacturing processes. Besides, in an embodiment, the bonding process and the package process of the driver 120 and the flexible panel 110 can be performed after the flexible panel 110 is removed from the rigid substrate 102, and the restraining component 130 can still effectively restrain contraction or expansion of the flexible panel 110 in the subsequent manufacturing processes, so as to protect an area where the flexible panel 110 is electrically connected to the driver 120 from being affected by the subsequently-performed thermal process or by environmental variations.

The flexible device 100 of the present embodiment includes the flexible panel 110, the driver 120, and the restraining component 130. The flexible panel 110 has the main region 112 and the driver bonding region 114 outside the main region 112. The driver 120 is electrically connected to the driver bonding region 114. The restraining component 130 is disposed adjacent to the driver bonding region 114. The rigidity of the restraining component 130, for example, is greater than the rigidity of the flexible panel 110, and the coefficient of thermal expansion CTE of the restraining component 130, for example, is smaller than the coefficient of thermal expansion $CTE_{CHIP}$ of the flexible panel 110. Additionally, in the present embodiment, the flexible device 100 can further includes the flexible circuit 126 and the molding compound 140. The flexible circuit 126 is disposed in the FPC bonding region 116 of the flexible panel 110, and the molding compound 140 encapsulates the driver 120.

According to the present embodiment, note that the rigidity of the restraining component 130 is greater than the rigidity of the flexible panel 110, and the coefficient of thermal expansion CTE of the restraining component 130 is smaller than the coefficient of thermal expansion $CTE_{CHIP}$ of the flexible panel 110. However, in another embodiment, the rigidity of the restraining component 130 is not defined, while the coefficient of thermal expansion CTE of the restraining compo- nent 130 is required to comply with following conditions: the difference $|CTE_{SUB}-CTE_{CHIP}|$ between the coefficient of thermal expansion $CTE_{SUB}$ of the flexible panel 110 and the coefficient of thermal expansion $CTE_{CHIP}$ of the driver 120 is greater than the difference $|CTE-CTE_{CHIP}|$ between the coefficient of thermal expansion CTE of the restraining component 130 and the coefficient of thermal expansion $CTE_{CHIP}$ of the driver 120, for instance. In other words, the difference between the thermal expansion of the restraining component 130 and the thermal expansion of the driver 120 is less than the difference between the thermal expansion of the flexible panel 110 and the thermal expansion of the driver 120, and thereby the restraining component 130 is able to restrain the contraction amount of the flexible panel 110. Here, the coefficient of thermal expansion CTE of the restraining component 130, for example, is between the coefficient of thermal expansion $CTE_{CHIP}$ of the driver 120 and the coefficient of thermal expansion $CTE_{SUB}$ of the flexible panel 110. In an alternative, the coefficient of thermal expansion CTE of the restraining component 130, for example, is smaller than the coefficient of thermal expansion $CTE_{CHIP}$ of the driver 120. Here, the coefficient of thermal expansion CTE of the restraining component 130 exemplarily ranges from about 1 ppm/c to about 30 ppm/c, the coefficient of thermal expansion $CTE_{SUB}$ of the flexible panel 110 exemplarily ranges from about 4 ppm/c to about 100 ppm/c, and the coefficient of thermal expansion $CTE_{CHIP}$ of the driver 120 exemplarily ranges from about 1 ppm/c to about 20 ppm/c. The rigidity of the restraining component 130, for example, ranges from about 3 Gpa to about 400 Gpa, preferably from about 8 Gpa to about 400 Gpa.

Figure 3A:
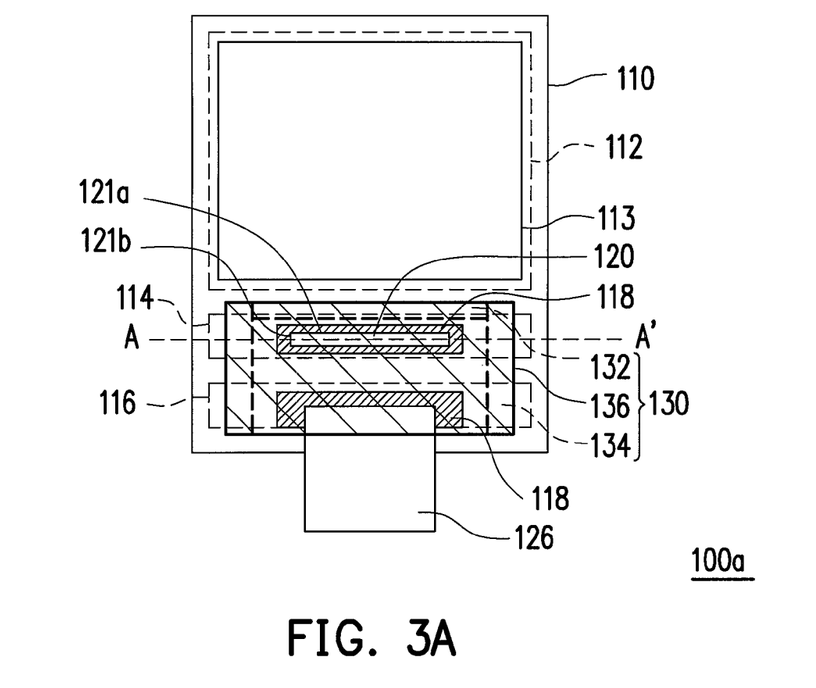
Figure 3B:
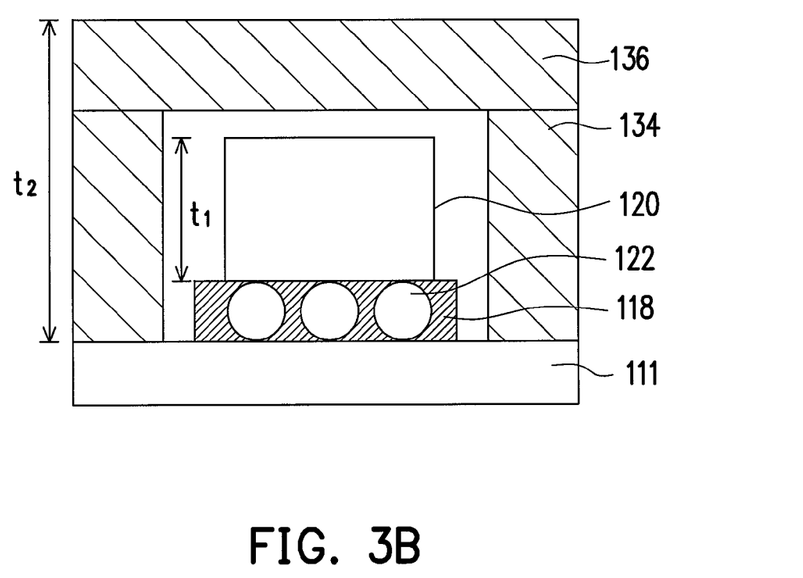

Moreover, in the present embodiment, the restraining component 130 is formed after the driver 120 is bonded to the driver bonding region 114, while the restraining component 130 in another embodiment can also be formed before the driver 120 is bonded to the driver bonding region 114. In other words, the present invention does not limit the order of forming the restraining component 130 and bonding the driver 120 to the driver bonding region 114. In addition, the material, the shape, and the thickness t2 of the restraining component 130 (e.g. the second contraction restraining bar 134), whether the molding compound 140 is formed, or the coverage of the molding compound 140 are not limited in the present invention. FIG. 3A to FIG. 7A are schematic top views illustrating a flexible device according to an embodiment of the present invention, and FIG. 3B to FIG. 7B are schematic cross-sectional views taken along the line A-A' depicted in FIG. 1A to FIG. 7A. As shown in FIG. 3A and FIG. 3B, the restraining component 130 in a flexible device 100a of an embodiment includes a first contraction restraining bar 132, two second contraction restraining bars 134, and a third contraction restraining bar 136, for instance. The two second contraction restraining bars 134 are connected to two ends of the first contraction restraining bar 132. The third contraction restraining bar 136 is connected to a top of the first contraction restraining bar 132 and the tops of the second contraction restraining bars 134, and the third contraction restraining bar 136 is located on the driver 120. That is to say, the restraining component 130 has a lid structure, i.e. the first contraction restraining bar 132 and the two second contraction restraining bars 134 serve as sidewalls, and the third contraction restraining bar 136 serves as an upper lid. Thereby, the contraction amount of the flexible panel 110 can be restrained by the restraining component 130. Besides, the restraining component 130 covers the driver 120 and a portion of the flexible circuit 126, so as to further protect the electrical connection between the driver 120 and the flexible panel 110 or the electrical connection between the flexible circuit 126 and the flexible panel 110 from being affected by external surroundings.

Figure 4A:
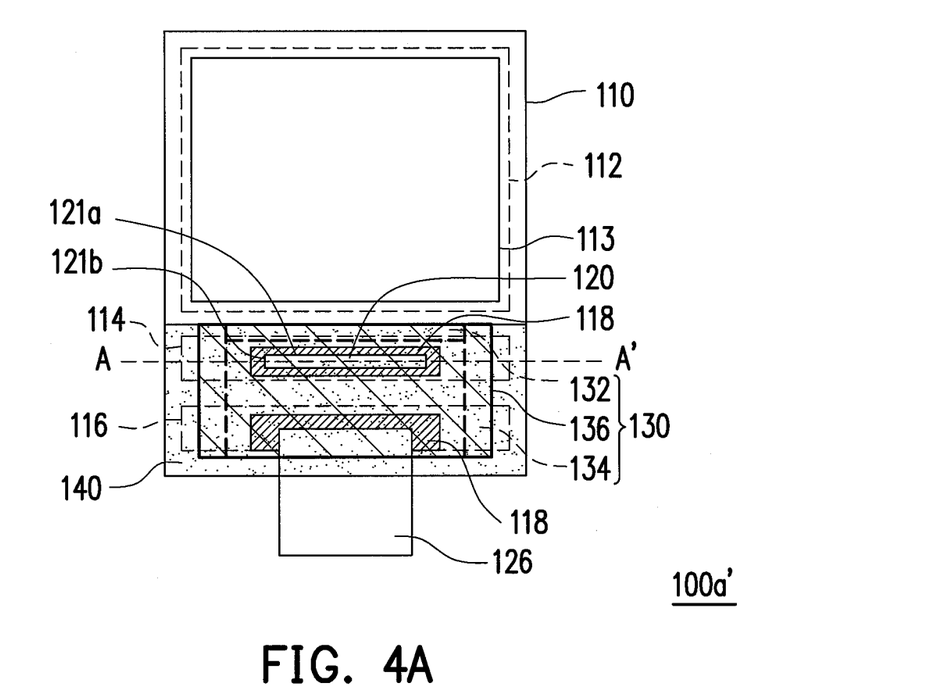
Figure 4B:
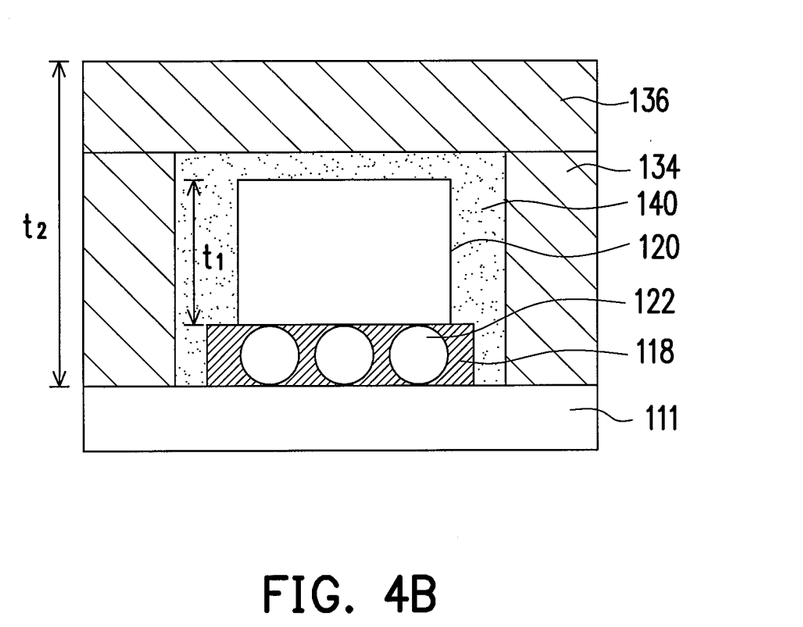

It should be mentioned that the flexible device 100a exemplarily shown in FIG. 3A and FIG. 3B does not include the molding compound 140, while a flexible device 100a' exemplarily shown in FIG. 4A and FIG. 4B includes the molding compound 140. Space surrounded by the restraining component 130 is filled with the molding compound 140, so as to encapsulate the driver 120 and cover the restraining component 130 and a portion of the flexible circuit 126. In other embodiments not illustrated in the drawings, the molding compound 140 can exclusively cover the restraining component 130 but does not fill the space surrounded by the restraining component 130.

Figure 5A:
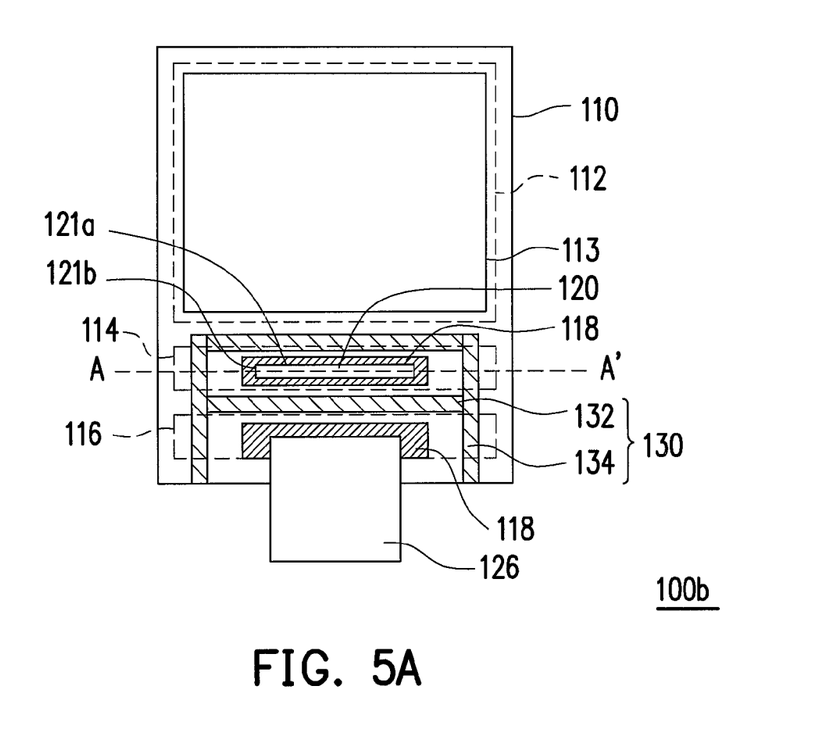
Figure 5B:
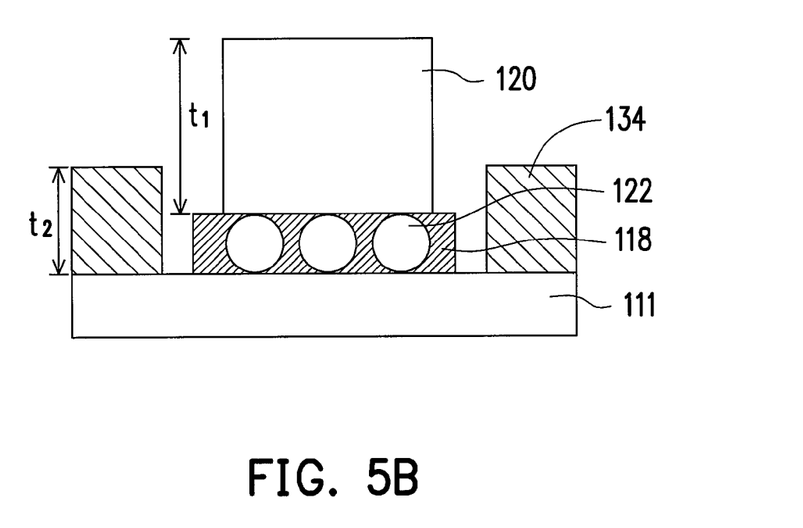
Figure 6A:
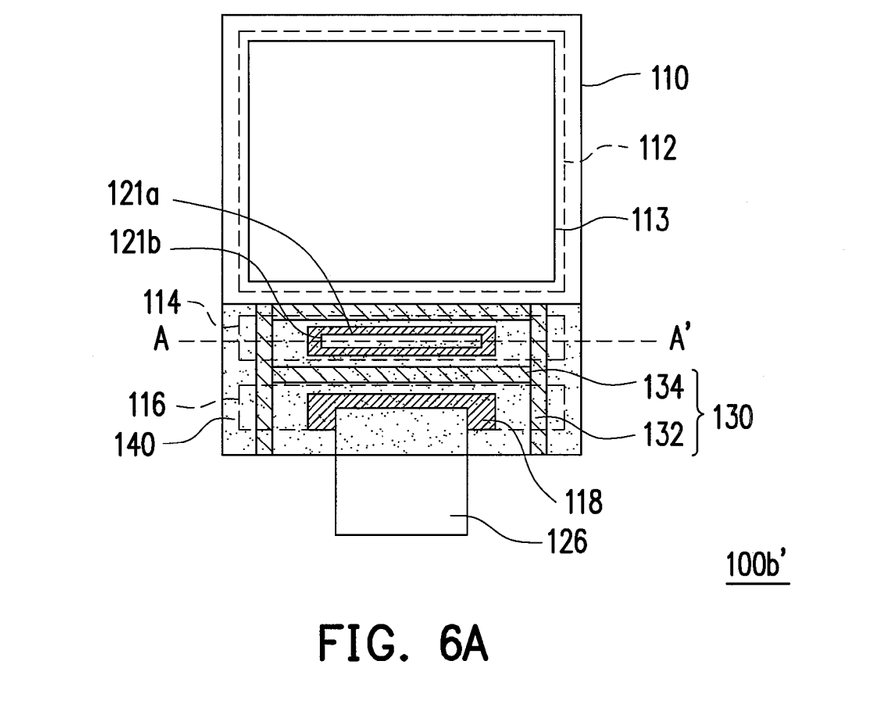
Figure 6B:
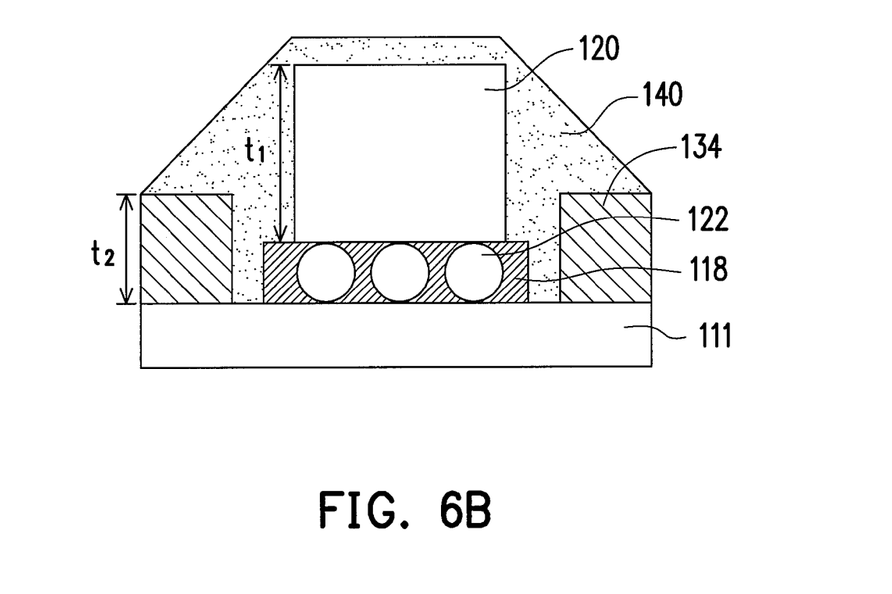

As shown in FIG. 5A and FIG. 5B, the restraining component 130 in the flexible device 100b of an embodiment includes two first contraction restraining bars 132 and two second contraction restraining bars 134, for instance. Each of the second contraction restraining bars 134 is connected to two ends of each of the first contraction restraining bars 132. According to the present embodiment, the thickness t2 of the restraining component 130 is exemplarily smaller than the thickness t1 of the driver 120. However, the thickness t2 of the restraining component 130 (e.g. the second contraction restraining bar 134) can also be greater than or equal to the thickness t1 of the driver 120. A material of the restraining component 130 can include metal, plastic, curable adhesive, or any other material. Here, the curable adhesive can be light curable adhesive, thermal curable adhesive, or a combination thereof. When the material of the restraining component 130 includes the curable adhesive, a method of curing the restraining component 130 further includes light irradiation (e.g. with use of visible light or ultraviolet light) or heating. The flexible device 100b exemplarily shown in FIG. 5A and FIG. 5B does not include the molding compound 140, while a flexible device 100b' exemplarily shown in FIG. 6A and FIG. 6B further includes the molding compound 140 that encapsulates the driver 120 and covers the restraining component 130 and a portion of the flexible circuit 126. During fabrication of the flexible devices 100b and 100b', the restraining component 130 is often formed before the driver 120 is formed.

Figure 7A:
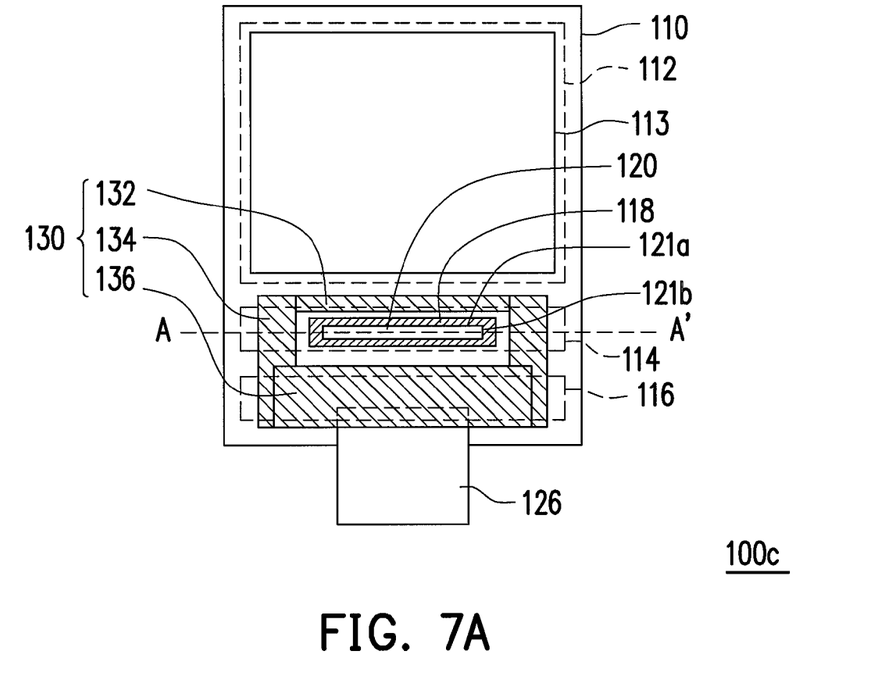
Figure 7B:
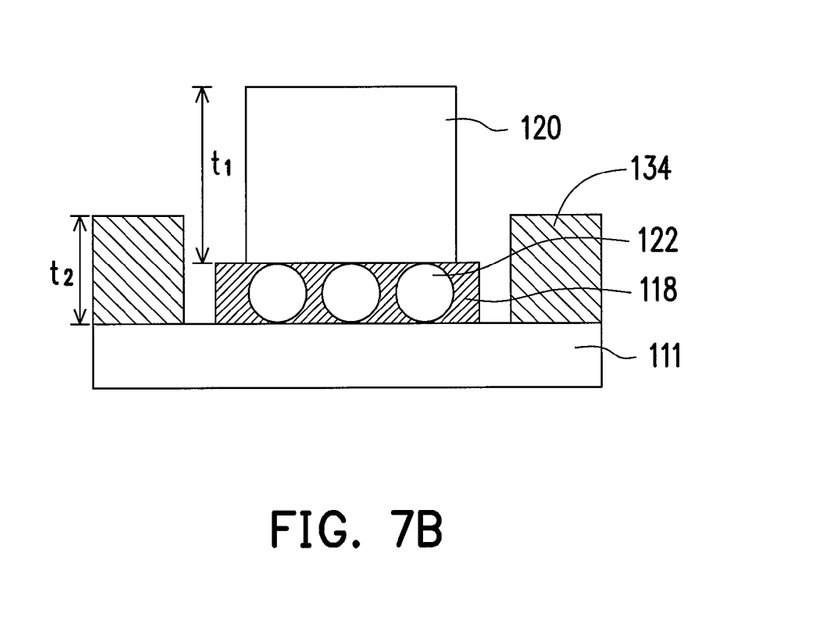

As shown in FIG. 7A and FIG. 7B, the restraining component 130 in a flexible device 100c of an embodiment includes a first contraction restraining bar 132, two second contraction restraining bars 134, and a third contraction restraining bar 136, for example. The second contraction restraining bars 134 are connected to two ends of the first contraction restraining bar 132. The third contraction restraining bar 136 is connected to the tops of the second contraction restraining bars 134 and is located on the flexible circuit 126. Besides, the third contraction restraining bar 136 covers at least a portion of the FPC bonding region 116 and the flexible circuit 126. Thereby, the contraction amount of the flexible panel 110 can be restrained by the restraining component 130. Besides, the restraining component 130 covers the flexible circuit 126, so as to further protect the electrical connection between the flexible circuit 126 and the flexible panel 110 from being affected by external surroundings. The flexible device 100c exemplarily shown in FIG. 7A and FIG. 7B does not include the molding compound 140, while the flexible device 100c can further include the molding compound 140 that encapsulates the driver 120 and covers the restraining component 130 according to another embodiment that is not illustrated in the drawings.

According to the previous embodiments, the rigidity of the restraining component 130 is greater than the rigidity of the flexible panel 110, and the coefficient of thermal expansion CTE of the restraining component 130 is smaller than the coefficient of thermal expansion $CTE_{CHIP}$ of the flexible panel 110. Alternatively, the difference $|CTE_{SUB}-CTE_{CHIP}|$ between the coefficient of thermal expansion $CTE_{SUB}$ of the flexible panel 110 and the coefficient of thermal expansion $CTE_{CHIP}$ of the driver 120 is greater than the difference $|CTE-CTE_{CHIP}|$ between the coefficient of thermal expansion CTE of the restraining component 130 and the coefficient of thermal expansion $CTE_{CHIP}$ of the driver 120. Therefore, the contraction amount of the flexible panel 110 can be restrained by the restraining component 130 in order to prevent significant contraction of the flexible panel 110 due to variations in temperature. Thereby, physical contact and satisfactory electrical connection between the flexible panel 110 and the driver 120 can be ensured. Furthermore, when the flexible panel 110 is removed from the rigid substrate 102, the contraction amount of the flexible panel 110 is restrained by the restraining component 130; therefore, the flexible panel 110 is not significantly contracted, and stress is not released thereby. As such, the conductive bumps 122 between the driver 120 and the flexible panel 110 are not peeled off or broken, satisfactory electrical connection between the driver 120 and the flexible panel 110 can be ensured, and the driver 120 can function in a normal manner.

Moreover, the restraining component 130 is disposed adjacent to the flexible circuit 126, and thus electrical connection between the flexible panel 110 and the flexible circuit 126 can be further enhanced. Accordingly, the flexible device of the present invention has great electrical properties and improved yield.

In light of the foregoing, the restraining component is disposed between the flexible panel and the driver according to the present invention. The rigidity of the restraining component is greater than the rigidity of the flexible panel, and the coefficient of thermal expansion of the restraining component is smaller than the coefficient of thermal expansion of the flexible panel. Alternatively, the difference $|CTE_{SUB}-CTE_{CHIP}|$ between the coefficient of thermal expansion of the flexible panel and the coefficient of thermal expansion of the driver is greater than the difference $|CTE-CTE_{CHIP}|$ between the coefficient of thermal expansion of the restraining component and the coefficient of thermal expansion of the driver. Therefore, the contraction amount of the flexible panel can be restrained by the restraining component in order to prevent significant contraction or expansion of the flexible panel due to variations in temperature. In particular, when the flexible panel is removed from the rigid substrate, the contraction amount of the flexible panel can be restrained by the restraining component; therefore, the flexible panel is not significantly contracted, and thus stress is not released thereby. As such, the conductive bumps between the driver and the flexible panel are not peeled off or broken, satisfactory electrical connection between the driver and the flexible panel 110 can be ensured, and the driver can function in a normal manner. Moreover, the restraining component is disposed adjacent to the flexible circuit, and the electrical connection between the flexible panel and the flexible circuit can be further enhanced. Besides, in the process of removing the flexible panel from the rigid substrate and then bonding the flexible panel to the driver, the restraining component can effectively restrain contraction or expansion of the flexible panel in the subsequent manufacturing processes, so as to protect the flexible panel, the driver, and an area where the flexible panel is electrically connected to the driver from being affected by the subsequently-performed thermal process or by environmental variations. As a result, the flexible device of the present invention has great electrical properties and improved yield.

Although the present invention has been described with reference to the above embodiments, it will be apparent to one of the ordinary skill in the art that modifications to the described embodiment may be made without departing from the spirit of the present invention. Accordingly, the scope of the present invention will be defined by the attached claims not by the above detailed descriptions.

What is claimed is:

1. A flexible device comprising:
    a flexible panel having a main region and a driver bonding region outside the main region;
    a driver electrically connected to the driver bonding region;
    a restraining component disposed adjacent to the driver, wherein rigidity of the restraining component is greater than rigidity of the flexible panel, and coefficient of thermal expansion of the restraining component is smaller than coefficient of thermal expansion of the flexible panel; and
    a flexible circuit, wherein the flexible panel further has a FPC bonding region electrically bonded to the flexible circuit, and the restraining component covers the driver, an edge portion of the flexible circuit, and a portion of the FPC bonding region.

2. The flexible device as claimed in claim 1, wherein the driver has a plurality of conductive bumps, and the driver is electrically connected to the driver bonding region through the conductive bumps.

3. The flexible device as claimed in claim 1, wherein the rigidity of the restraining component ranges from about 3 Gpa to about 400 Gpa.

4. The flexible device as claimed in claim 1, the coefficient of thermal expansion of the restraining component being CTE, the coefficient of the initial expansion of the flexible panel being $CTE_{SUB}$, coefficient of thermal expansion of the driver being $CTE_{CHIP}$, wherein a difference $|CTE_{SUB}-CTE_{CHIP}|$ between the coefficient of thermal expansion of the flexible panel and the coefficient of thermal expansion of the driver is greater than a difference $|CTE-CTE_{CHIP}|$ between the coefficient of thermal expansion of the restraining component and the coefficient of thermal expansion of the driver.

5. The flexible device as claimed in claim 1, wherein thickness of the restraining component is greater than thickness of the driver.

6. The flexible device as claimed in claim 1, wherein thickness of the restraining component is smaller than thickness of the driver.

7. The flexible device as claimed in claim 1, wherein a contraction amount of the flexible panel along a first direction is restrained by the restraining component, the driver has a pair of long sides and a pair of short sides, and the first direction is substantially parallel to the pair of long sides, the restraining component comprising at least one first contraction restraining bar, two second contraction restraining bars and a third contraction restraining bar, and an extension direction of the first contraction restraining bar being substantially parallel to the pair of long sides, each of the second contraction restraining bars being connected to two ends of the at least one first contraction restraining bar, the third contraction restraining bar being connected to a top of the at least one first contraction restraining bar and tops of the two second contraction restraining bars, and an extension direction of each of the second contraction restraining bars being substantially perpendicular to the at least one first contraction restraining bar.

8. The flexible device as claimed in claim 1, wherein a material of the restraining component comprises metal or plastic.

9. The flexible device as claimed in claim 1, further comprising an anisotropic conductive film disposed on the driver bonding region, wherein the driver is electrically connected to the driver bonding region through the anisotropic conductive film.

10. The flexible device as claimed in claim 1, wherein the flexible panel is a liquid crystal display panel, an electroluminescent display panel, an electro-phoretic display panel or a combination thereof, wherein the driver comprises a driving IC, and wherein the restraining component is disposed adjacent to the driver bonding region.

11. A flexible device comprising:
    a flexible panel having a main region and a driver bonding region outside the main region;
    a driver electrically connected to the driver bonding region;
    a restraining component disposed adjacent to the driver bonding region, coefficient of thermal expansion of the restraining component being CTE, coefficient of thermal expansion of the flexible panel being $CTE_{SUB}$, coefficient of thermal expansion of the driver being $CTE_{CHIP}$, wherein a difference $|CTE_{SUB}-CTE_{CHIP}|$ between the coefficient of thermal expansion of the flexible panel and the coefficient of thermal expansion of the driver is greater than a difference $|CTE-CTE_{CHIP}|$ between the coefficient of thermal expansion of the restraining component and the coefficient of thermal expansion of the driver; and
    a flexible circuit, wherein the flexible panel further has a FPC bonding region electrically bonded to the flexible circuit, and the restraining component covers the driver, an edge portion of the flexible circuit, and a portion of the FPC bonding region.

12. The flexible device as claimed in claim 11, wherein the CTE approximately ranges from about 1 ppm/c to about 30 ppm/c, the $CTE_{SUB}$ approximately ranges from about 4 ppm/c to about 100 ppm/c, and the $CTE_{CHIP}$ approximately ranges from about 1 ppm/c to about 20 ppm/c.

13. The flexible device as claimed in claim 11, wherein rigidity of the restraining component ranges from about 3 Gpa to about 400 Gpa.

14. A flexible device comprising:
    a flexible panel having a main region, a driver bonding region outside the main region, and a flexible printed circuit bonding region outside the main region;
    a driver electrically connected to the driver bonding region;
    a flexible circuit, being electrically connected to the flexible printed circuit bonding region; and
    a restraining component disposed adjacent to the driver, wherein rigidity of the restraining component is greater than rigidity of the flexible panel, and coefficient of thermal expansion of the restraining component is smaller than coefficient of thermal expansion of the flexible panel,
    wherein a contraction amount of the flexible panel along a first direction is restrained by the restraining component, the driver has a pair of long sides and a pair of short sides, and the first direction is substantially parallel to the pair of long sides, the restraining component comprising at least one first contraction restraining bar, two second contraction restraining bars and a third contraction restraining bar, and an extension direction of the first contraction restraining bar being substantially parallel to the pair of long sides, each of the second contraction restraining bars being connected to two ends of the at least one first contraction restraining bar, the third contraction restraining bar being connected to a top of the at least one first contraction restraining bar and tops of the two second contraction restraining bars, and an extension direction of each of the second contraction restraining bars being substantially perpendicular to the at least one first contraction restraining bar, and the second contraction restraining bars of the restraining component extend from the driver bonding region to the FPC bonding region.

15. A flexible device comprising:
a flexible panel having a main region, a driver bonding region outside the main region, and a flexible printed circuit bonding region outside the main region;
a driver electrically connected to the driver bonding region;
a flexible circuit, being electrically connected to the flexible printed circuit bonding region; and
a restraining component disposed adjacent to the driver, wherein rigidity of the restraining component is greater than rigidity of the flexible panel, and coefficient of thermal expansion of the restraining component is smaller than coefficient of thermal expansion of the flexible panel, and the restraining component extends from the driver bonding region to the FPC bonding region.

* * * * *